(12) United States Patent
Lacouture et al.

(10) Patent No.: US 11,143,694 B2
(45) Date of Patent: Oct. 12, 2021

(54) WIDE INJECTION RANGE OPEN CIRCUIT VOLTAGE DECAY SYSTEM

(71) Applicant: Texas Tech University System, Lubbock, TX (US)

(72) Inventors: Shelby Lacouture, Lubbock, TX (US); Stephen Bayne, Lubbock, TX (US)

(73) Assignee: TEXAS TECH UNIVERSITY SYSTEM, Lubbock, TX (US)

( * ) Notice: Subject to any disclaimer, the term of this patent is extended or adjusted under 35 U.S.C. 154(b) by 0 days.

(21) Appl. No.: 16/758,810

(22) PCT Filed: Oct. 26, 2018

(86) PCT No.: PCT/IB2018/058394
§ 371 (c)(1),
(2) Date: Apr. 23, 2020

(87) PCT Pub. No.: WO2019/082151
PCT Pub. Date: May 2, 2019

(65) Prior Publication Data
US 2020/0341051 A1    Oct. 29, 2020

Related U.S. Application Data

(60) Provisional application No. 62/577,888, filed on Oct. 27, 2017.

(51) Int. Cl.
*G01R 31/00* (2006.01)
*G01R 31/26* (2020.01)
(Continued)

(52) U.S. Cl.
CPC .......... *G01R 31/2642* (2013.01); *G01R 3/00* (2013.01); *G01R 31/2648* (2013.01);
(Continued)

(58) Field of Classification Search
CPC ....... H01L 2924/00014; H01L 2924/00; H01L 2924/0002; H01L 2224/05599;
(Continued)

(56) References Cited

U.S. PATENT DOCUMENTS 4,090,132 A    5/1978 Alexander
4,564,807 A    1/1986 Ikezi et al.
(Continued)

FOREIGN PATENT DOCUMENTS

WO    2011040883 A1    4/2011

OTHER PUBLICATIONS

International Patent Application No. PCT/US2018/058394, International Search Report and Written Opinion, 11 pages (dated Feb. 26, 2019).
(Continued)

*Primary Examiner* — Raul J Rios Russo
(74) *Attorney, Agent, or Firm* — Kevin L. Soules; Loza & Loza, LLP

(57) ABSTRACT

A system, method and apparatus for measuring carrier lifetime of a device comprises subjecting a test device to a voltage via a voltage source associated with the test system, disconnecting the test device from the voltage source, measuring the voltage as a function of time, measuring the current as a function of time, and determining a carrier lifetime of the test piece according to the slope of the measured voltage and the measured current.

20 Claims, 13 Drawing Sheets

(51) Int. Cl.
*H01L 21/66* (2006.01)
*G01R 3/00* (2006.01)
*G01R 31/28* (2006.01)

(52) U.S. Cl.
CPC .......... *G01R 31/2891* (2013.01); *H01L 22/20* (2013.01); *H01L 2224/023* (2013.01); *H01L 2224/05599* (2013.01); *H01L 2924/00* (2013.01); *H01L 2924/0002* (2013.01); *H01L 2924/00014* (2013.01)

(58) Field of Classification Search
CPC ..... H01L 22/20; H01L 2224/023; G01R 3/00; G01R 31/2891; G01R 31/2642; G01R 31/2648; G01R 31/2633
USPC ......... 324/71, 378, 403, 415, 425, 500, 537, 324/754.01
See application file for complete search history.

(56) References Cited

U.S. PATENT DOCUMENTS

| | | |
|---|---|---|
| 5,153,503 A | 10/1992 | Yahata |
| 6,198,301 B1 | 3/2001 | Chetlur et al. |
| 7,039,566 B2 | 5/2006 | Koike |
| 2015/0270014 A1* | 9/2015 | Ellis ........................ G11C 29/04 365/201 |
| 2016/0139212 A1* | 5/2016 | Lin ........................ G06F 30/367 702/108 |
| 2016/0246904 A1* | 8/2016 | Meagher ................. G06F 30/20 |
| 2016/0248250 A1* | 8/2016 | Meagher ................. G06F 30/20 |
| 2017/0219645 A1* | 8/2017 | Cadigan ............. G01R 31/2851 |
| 2017/0228479 A1* | 8/2017 | Meagher ................ G05B 17/02 |

OTHER PUBLICATIONS

Lacouture et al. "An open circuit voltage decay system for performing injection dependent lifetime spectroscopy", vol. 88, issue 9, 36 pages (Sep. 14, 2017).

* cited by examiner

WIDE INJECTION RANGE OPEN CIRCUIT
VOLTAGE DECAY SYSTEM

CROSS-REFERENCE TO RELATED APPLICATIONS

This application is the U.S. National Stage of International Patent Application No. PCT/IB2018/058394 filed on Oct. 26, 2018, which claims the benefit of priority from U.S. Provisional Patent Application No. 62/577,888 filed on Oct. 27, 2017, the disclosures of the foregoing applications being incorporated herein by reference in their entirety for all applicable purposes.

TECHNICAL FIELD

Embodiments are generally related to the field of semiconductors. Embodiments are also related to the field of analyzing devices. Embodiments are further related to methods and systems for determining carrier lifetime of semiconductor devices. Embodiments are also related to advanced characterization of semiconductor devices before and after electrothermal stress.

BACKGROUND

Since the invention of the transistor in 1947 solid-state electronic devices have revolutionized electrical engineering. Electronics, have, in a very real sense, irrevocably altered nearly every aspect of human existence. Supplanting the older technologies, the first solid state devices were mostly considered viable alternatives to the more entrenched tubes in small portable devices, e.g., transistor radios, etc.

The first solid-state devices were made from the material Germanium (Ge), which, while functional, had material properties that were not well suited for many applications. The material that displaced Ge (i.e. Silicon (Si)), had far better intrinsic material properties for the intended purpose of controlling the conduction of electric current. Eventually, Si devices took over almost all applications. While Si and other semiconductor materials are better suited for many low and medium power applications, the last frontier for semiconductor devices, the arena of very high voltage and high current, seems to be the province of a relatively new group of semiconducting materials collectively referred to as (Wide Bandgap) WBG semiconductors. These materials are capable of holding off higher voltages than equivalent sized Si devices, of conducting greater amounts of current, and operating at much higher temperatures than their Si based counterparts.

The new breed of WBG semiconductors have innate material parameters that make them very attractive for high power and high temperature applications. However, the materials, by virtue of their very newness, are still evolving to the point where viable devices can be produced. It is likely that in the near future such materials will be as commonplace as Si is now. This will make electronic control of high energy systems a reality. These devices will aid in the advance of many other technologies such as wind power, solar, etc. They will also likely supplant electromechanical systems used in Power Grid distribution systems, and make possible smaller and more efficient technologies such as "smart" transformers.

In order for these materials to reach their potential however, the material and how the material operates in particular device structures must be thoroughly understood. The evolution of any semiconductor or semiconductor-based device is an iterative process that involves theories, numerical physics-based modeling, initial device designs and physical and electrical evaluation. This process can be repeated until viable designs are obtained. The mathematical modeling of devices requires the material's chemical and electrical interactions with dopants and defects to be well catalogued, a requirement that is still quite lacking for SiC compared to many other semiconductor materials. The evaluation of devices must be through physical testing, especially with the relative newness of the WBG materials.

A thorough understanding of the electrical activity of both uncontrolled elements, typically referred to as "defects" and intentionally introduced elements, termed "dopants" within any given semiconductor is a requirement for accurate mathematical characterization and computer-based simulation. Many of the elements used for producing donor or acceptor sites are relatively well cataloged in SiC. Although constituting a much smaller list than that for Si, dopants are added in very highly controlled amounts (ND or NA), and due to the close positioning of their energy depth to either the conduction or the valence band, they act almost solely to produce free carriers, and have little or no recombination activity themselves. The introduction of elements (intentionally, or otherwise) with an energy depth closer to the mid-gap level than dopant atoms can have a profound effect on the lifetime of free carriers through the extrinsic process of Recombination-Generation (R-G), more generally referred to as Shockley-Read-Hall (SRH) Recombination-Generation.

These uncontrolled R-G processes and their effect on carrier lifetime must be better understood, in order to produce more viable power devices based on SiC. An example of the importance of carrier lifetime is its effect on PiN structures: almost all high voltage power device designs rely on conductivity modulation occurring within an "intrinsic" (not truly intrinsic, but a very lightly doped) semiconductor layer, conductivity modulation greatly reduces the resistance and on-state voltage of a conducting device. Conductivity modulation results from high-level injection of minority carriers from a highly doped semiconductor into the aforementioned, lightly doped intrinsic layer. At high-level injection, roughly defined as $\Delta n \gg n_0 + p_0$, for p-type material, the majority carrier level must increase in pace with the injected minority carriers to maintain charge neutrality. This large enhancement of free carriers is the reason for the reduction in the intrinsic layer's resistance. For this effect to reduce the resistance of the intrinsic layer however, the injected carriers must not recombine before crossing the width of the intrinsic layer. Thus, carrier lifetime is of paramount importance in such devices.

In certain prior art approaches physics-based semiconductor simulation software suites are used to demonstrate the impact of varying carrier lifetime on simulated SiC PiN diodes, both in terms of static characteristics and in high current pulsed conditions. These efforts have only resulted in the determination of the effective lifetime (within a certain degree of error). No other information about the dominant defect giving rise to this effective carrier lifetime is known.

A relatively new group of methods for extracting not only the effective lifetime, but also the minority lifetimes (and hence the Ambipolar lifetime) as well as the energy depth of the defect, $\Delta E_T$, is rapidly gaining acceptance in the scientific community, especially in the field of solar cells. The methods, broadly referred to as Lifetime Spectroscopy (LS) techniques, are based on the systematic application of the long-standing SRH statistics to semiconductors while sweeping a known quantity such as doping level or temperature.

The only way to ascertain how a particular device will actually perform or how long the unit will physically last in any given type of application is to either place the device in the actual system, or to place the device in an evaluation platform that places the same type and duration of electrical stress (or even greater electrical stress for accelerated evaluation) the chosen application would place on the device. In the case of low and medium power Si devices, the application of electrical stress within an evaluation system is quite easily implemented, and in general consist of high volume, low and medium voltage and current application along with concurrent monitoring of the unit's performance. For the newer breed of high voltage and high current power devices, including the relatively new WBG power devices, there are no off the shelf commercial solutions for high volume evaluation available at the needed voltage/current levels. Even something as simple as characterizing a power device becomes complicated by the native voltage and current levels at which these devices can operate, especially since characterization is often desirable at levels that far exceed a device's quoted continuous values.

As such, there is a need in the art for system and methods that evaluate carrier lifetime.

SUMMARY

The following summary is provided to facilitate an understanding of some of the innovative features unique to the embodiments disclosed and is not intended to be a full description. A full appreciation of the various aspects of the embodiments can be gained by taking the entire specification, claims, drawings, and abstract as a whole.

It is, therefore, one aspect of the disclosed embodiments to provide a method and system for evaluating semiconductors.

It is another aspect of the disclosed embodiments to provide a method and system for identifying carrier life of semiconductor devices.

It is yet another aspect of the disclosed embodiments to provide an enhanced method and system for a wide-injection range open circuit voltage decay system.

In the embodiments disclosed herein, materials can be evaluated for experimental grade devices both in terms of their external electrical characteristics, their suitability within specified applications, and by extracting fundamental material parameters from packaged WBG power devices.

For example, SiC PiN high voltage diodes and SiC SGTOs can be evaluated for suitability and device reliability in two pulse regimes; both a "wide" pulse (e.g. approximately 1 ms at a current of 1 kA repetitively) and a "narrow" pulse (e.g. 100 μs Full Width Half Maximum (FWHM) at varying current levels). The devices are characterized (in situ in the narrow pulse system) in terms of external IV performance and the PiN diodes can be characterized with LS methods.

In certain embodiments, custom systems are disclosed that can provide a wide pulse evaluation system meant to mimic a high energy inertial extraction application. One example of such a system might be employed for a portable rail gun designed by modifying an aircraft ground-power generator for the intended purpose, and employing the experimental SGTOs in a three phase controlled rectifier to extract electrical energy from the inertial energy of the rotor.

A narrow pulse evaluation system is designed to mimic short, high-energy pulse applications (e.g., energy weapons, electric-reactive armor, etc.).

Furthermore, in the embodiments disclosed herein a unique, wide injection range, Open Circuit Voltage Decay (OCVD) system is disclosed which can perform the various LS techniques on devices such as PiN diodes.

As semiconductor devices continue to improve in terms of external electrical characteristics, e.g. voltage hold off, current conduction and in terms of devices reliability and lifetime, the main limiting factor for any particular semiconductor type is the material quality; any unintentional defects have the ability to reduce the device's capabilities and eventually destroy it. One of the most important fundamental parameters that can be used to characterize the quality of a material is the recombination activity due to bulk defects. The Lifetime Spectroscopy (LS) methods disclosed herein offer a powerful tool to analyze this bulk recombination activity. LS techniques, due to the nature of the measurement, also fill in the gaps left by prior art methods concerning the recombination activity of elements within a given semiconductor material.

The OCVD method provides a viable technique for extracting the effective lifetime from packaged pn junction devices. Indeed, the embodiments have been shown to be more accurate than the various optical methods used for the same purpose, mostly due to the fact that the lifetime itself is the fundamental quantity measured with the OCVD technique, as opposed to extrapolating the lifetime from a sample's conductance, as in the optical methods. The latter techniques tend to give falsely elevated low-level lifetimes due to altered sample conductance that occurs due to carrier trapping.

In principle the method comprises applying a forward bias for a finite time and then disconnecting the junction (ideally, in a Galvanic manner) from the source. Once the source is removed from the junction, the voltage immediately drops by an amount $\Delta V$ due to the junction's internal series resistance and then decays (assuming no parallel resistance) due to recombination of the injected carriers. While the OCVD technique is useful for extracting the effective carrier lifetime from packaged pn junction devices, the methods and systems disclosed herein provide a system to perform OCVD on other similar devices as well.

The aforementioned aspects and other objectives and advantages can now be achieved as described herein. An analytics system and/or apparatus comprises a voltage source, a switch configured to disconnect a test piece from the source, an assembly configured to collect a voltage versus time measurement and a current versus time measurement, and an analytics module configured to identify a carrier lifetime of the test piece according to the measured voltage versus time and the measured current versus time. The voltage source can further comprise a pulsed voltage source. In an embodiment the system further comprises at least two low equivalent series resistance capacitors charged by the voltage source.

In an embodiment, the analytics module further comprises: at least one processor; and a storage device communicatively coupled to the at least one processor, the storage device storing instructions which, when executed by the at least one processor, cause the at least one processor to perform operations comprising: determining a slope of a waveform collected from the voltage versus time measurement and the current versus time measurement and calculating a carrier lifetime from the slope.

In an embodiment the system further comprises a control configured to provide a variable sampling rate for the voltage versus time measurement. The system further comprises a current versus time measurement applicable to current in a range from 1 milliamp to 100 amps. In certain embodiments the work piece comprises a p-n junction device.

In another embodiment a method for measuring carrier lifetime comprises subjecting a test device to a voltage via a voltage source associated with the test system, disconnecting the test device from the voltage source, measuring a voltage as a function of time, measuring a current as a function of time, and determining a carrier lifetime of the test piece according to the measured voltage and the measured current. The voltage source further comprises a pulsed voltage source. The method can further comprise charging at least two low equivalent series resistance capacitors with the voltage source.

In an embodiment the method further comprises determining a slope of a waveform of the voltage as a function of time and the current as a function of time and calculating a carrier lifetime from the slope. In an embodiment a variable sampling rate control is used to collect the voltage as a function of time and the monitored current range comprises 1 milliamp to 100 amps. In an embodiment the test piece comprises a p-n junction device.

BRIEF DESCRIPTION OF THE FIGURES

The accompanying figures, in which like reference numerals refer to identical or functionally-similar elements throughout the separate views and which are incorporated in and form a part of the specification, further illustrate the embodiments and, together with the detailed description, serve to explain the embodiments disclosed herein.

DETAILED DESCRIPTION

Figure 1:
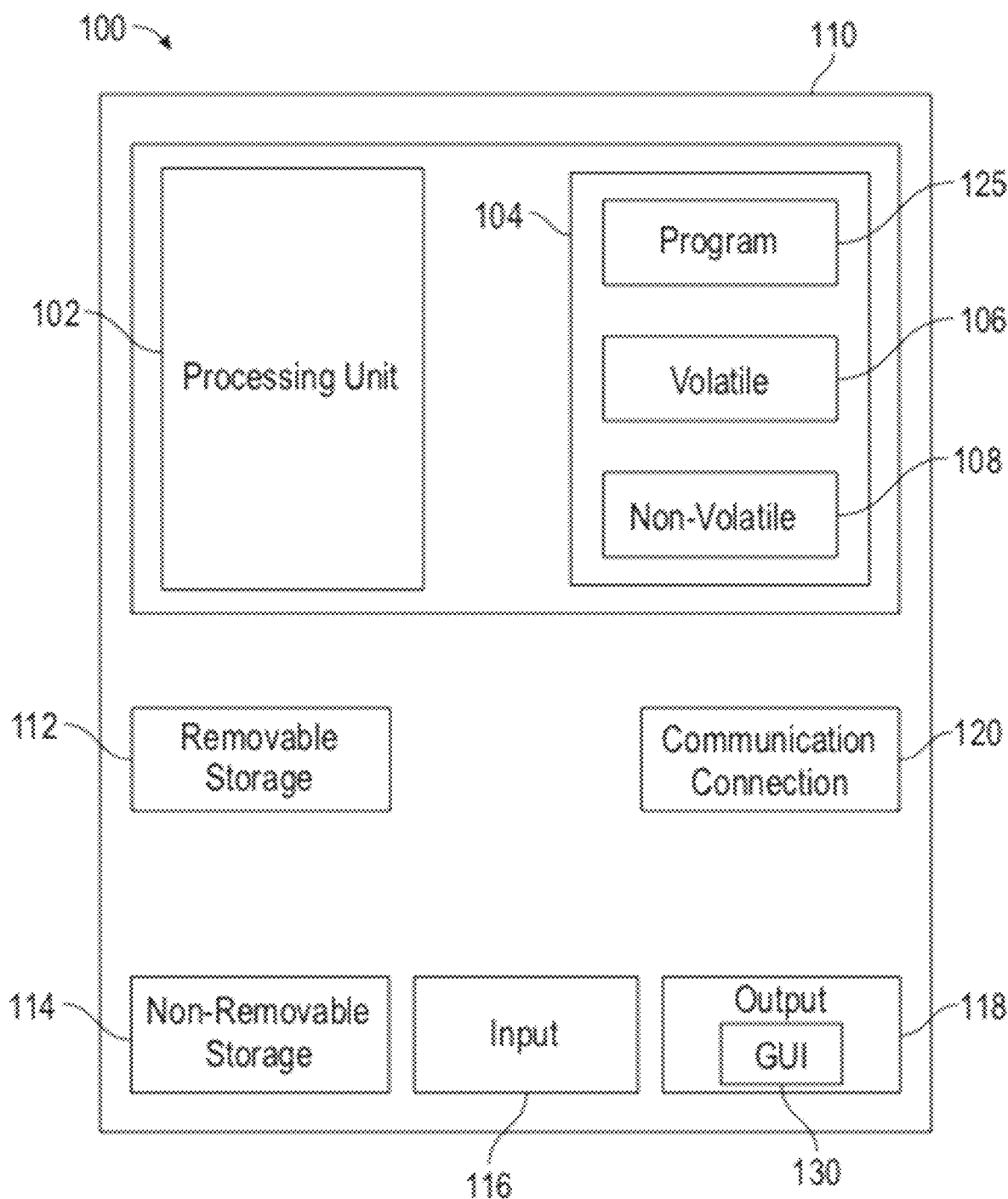
FIG. 1 depicts a block diagram of a computer system which is implemented in accordance with the disclosed embodiments.

The particular values and configurations discussed in these non-limiting examples can be varied and are cited merely to illustrate at least one embodiment and are not intended to limit the scope thereof.

U.S. Provisional patent application 62/577,888, filed Oct. 27, 2017 titled "Wide Injection Range Open Circuit Voltage Decay System" is herein incorporated by reference in its entirety.

Example embodiments will now be described more fully hereinafter with reference to the accompanying drawings, in which illustrative embodiments are shown. The embodiments disclosed herein can be embodied in many different forms and should not be construed as limited to the embodiments set forth herein; rather, these embodiments are provided so that this disclosure will be thorough and complete, and will fully convey the scope of the embodiments to those skilled in the art. Like numbers refer to like elements throughout.

The terminology used herein is for the purpose of describing particular embodiments only and is not intended to be limiting. As used herein, the singular forms "a", "an", and "the" are intended to include the plural forms as well, unless the context clearly indicates otherwise. It will be further understood that the terms "comprise" and/or "comprising," when used in this specification, specify the presence of stated features, integers, steps, operations, elements, and/or components, but do not preclude the presence or addition of one or more other features, integers, steps, operations, elements, components, and/or groups thereof.

Throughout the specification and claims, terms may have nuanced meanings suggested or implied in context beyond an explicitly stated meaning. Likewise, the phrase "in one embodiment" as used herein does not necessarily refer to the same embodiment and the phrase "in another embodiment" as used herein does not necessarily refer to a different embodiment. It is intended, for example, that claimed subject matter include combinations of example embodiments in whole or in part.

Unless otherwise defined, all terms (including technical and scientific terms) used herein have the same meaning as commonly understood by one of ordinary skill in the art. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

It is contemplated that any embodiment discussed in this specification can be implemented with respect to any method, kit, reagent, or composition of the invention, and vice versa. Furthermore, compositions of the invention can be used to achieve methods of the invention.

It will be understood that particular embodiments described herein are shown by way of illustration and not as limitations of the invention. The principal features of this invention can be employed in various embodiments without departing from the scope of the invention. Those skilled in the art will recognize or be able to ascertain using no more than routine experimentation, numerous equivalents to the specific procedures described herein. Such equivalents are considered to be within the scope of this invention and are covered by the claims.

The use of the word "a" or "an" when used in conjunction with the term "comprising" in the claims and/or the specification may mean "one," but it is also consistent with the meaning of "one or more," "at least one," and "one or more than one." The use of the term "or" in the claims is used to mean "and/or" unless explicitly indicated to refer to alternatives only or the alternatives are mutually exclusive, although the disclosure supports a definition that refers to only alternatives and "and/or." Throughout this application, the term "about" is used to indicate that a value includes the inherent variation of error for the device, the method being employed to determine the value, or the variation that exists among the study subjects.

As used in this specification and claim(s), the words "comprising" (and any form of comprising, such as "comprise" and "comprises"), "having" (and any form of having, such as "have" and "has"), "including" (and any form of including, such as "includes" and "include") or "containing" (and any form of containing, such as "contains" and "contain") are inclusive or open-ended and do not exclude additional, unrecited elements or method steps.

The term "or combinations thereof" as used herein refers to all permutations and combinations of the listed items preceding the term. For example, "A, B, C, or combinations thereof" is intended to include at least one of: A, B, C, Aft AC, BC, or ABC, and if order is important in a particular context, also BA, CA, CB, CBA, BCA, ACB, BAC, or CAB. Continuing with this example, expressly included are combinations that contain repeats of one or more item or term, such as BB, AAA, Aft BBC, AAABCCCC, CBBAAA, CABABB, and so forth. The skilled artisan will understand that typically there is no limit on the number of items or terms in any combination, unless otherwise apparent from the context.

All of the compositions and/or methods disclosed and claimed herein can be made and executed without undue experimentation in light of the present disclosure. While the compositions and methods of this invention have been described in terms of preferred embodiments, it will be apparent to those of skill in the art that variations may be applied to the compositions and/or methods and in the steps or in the sequence of steps of the method described herein without departing from the concept, spirit and scope of the invention. All such similar substitutes and modifications apparent to those skilled in the art are deemed to be within the spirit, scope and concept of the invention as defined by the appended claims.

Figure 2:
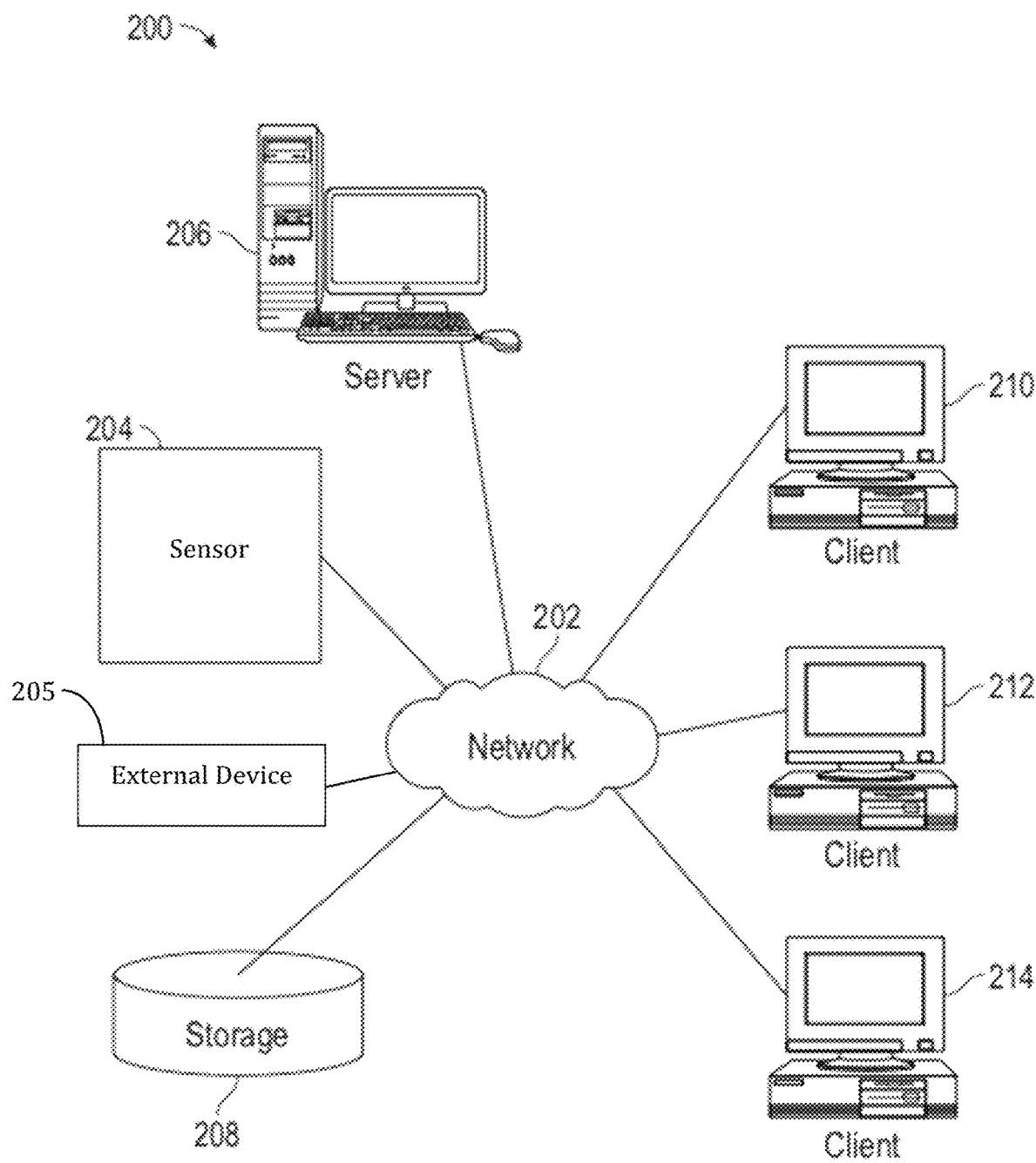
FIG. 2 depicts a graphical representation of a network of data-processing devices in which aspects of the present embodiments may be implemented.
Figure 3:
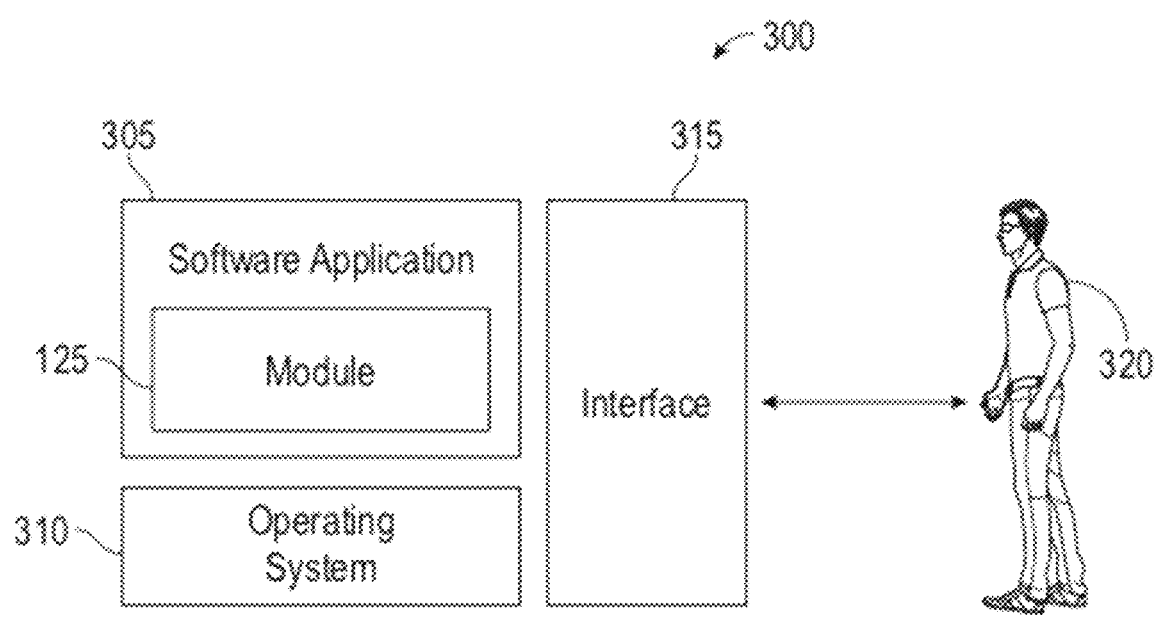
FIG. 3 illustrates a computer software system for directing the operation of the data-processing system depicted in FIG. 1, in accordance with an example embodiment.

FIGS. 1-3 are provided as exemplary diagrams of data-processing environments in which embodiments of the present invention may be implemented. It should be appreciated that FIGS. 1-3 are only exemplary and are not intended to assert or imply any limitation with regard to the environments in which aspects or embodiments of the disclosed embodiments may be implemented. Many modifications to the depicted environments may be made without departing from the spirit and scope of the disclosed embodiments.

A block diagram of a computer system 100 that executes programming for implementing the methods and systems disclosed herein is shown in FIG. 1. A general computing device in the form of a computer 110 may include a processing unit 102, memory 104, removable storage 112, and non-removable storage 114. Memory 104 may include volatile memory 106 and non-volatile memory 108. Computer 110 may include or have access to a computing environment that includes a variety of transitory and non-transitory computer-readable media such as volatile memory 106 and non-volatile memory 108, removable storage 112 and non-removable storage 114. Computer storage includes, for example, random access memory (RAM), read only memory (ROM), erasable programmable read-only memory (EPROM) and electrically erasable programmable read-only memory (EEPROM), flash memory or other memory technologies, compact disc read-only memory (CD ROM), Digital Versatile Disks (DVD) or other optical disk storage, magnetic cassettes, magnetic tape, magnetic disk storage, or other magnetic storage devices, or any other medium capable of storing computer-readable instructions as well as data, including data comprising frames of video.

Computer 110 may include or have access to a computing environment that includes input 116, output 118, and a communication connection 120. The computer may operate in a networked environment using a communication connection to connect to one or more remote computers or devices. The remote computer may include a personal computer (PC), server, router, network PC, a peer device or other common network node, or the like. The remote device may include a sensor, photographic camera, video camera, tracking device, or the like. The communication connection may include a Local Area Network (LAN), a Wide Area Network (WAN) or other networks. This functionality is described in more fully in the description associated with FIG. 2 below.

Output 118 is most commonly provided as a computer monitor, but may include any computer output device. Output 118 may also include a data collection apparatus associated with computer system 100. In addition, input 116, which commonly includes a computer keyboard and/or pointing device such as a computer mouse, computer track pad, or the like, allows a user to select and instruct computer system 100. A user interface can be provided using output 118 and input 116. Output 118 may function as a display for displaying data and information for a user and for interactively displaying a graphical user interface (GUI) 130.

Note that the term "GUI" generally refers to a type of environment that represents programs, files, options, and so forth by means of graphically displayed icons, menus, and dialog boxes on a computer monitor screen. A user can interact with the GUI to select and activate such options by directly touching the screen and/or pointing and clicking with a user input device 116 such as, for example, a pointing device such as a mouse, and/or with a keyboard. A particular item can function in the same manner to the user in all applications because the GUI provides standard software routines (e.g., module 125) to handle these elements and report the user's actions. The GUI can further be used to display the electronic service image frames as discussed below.

Computer-readable instructions, for example, program module 125, which can be representative of other modules described herein, are stored on a computer-readable medium and are executable by the processing unit 102 of computer 110. Program module 125 may include a computer application. A hard drive, CD-ROM, RAM, Flash Memory, and a USB drive are just some examples of articles including a computer-readable medium.

FIG. 2 depicts a graphical representation of a network of data-processing systems 200 in which aspects of the present invention may be implemented. Network data-processing system 200 is a network of computers in which embodiments of the present invention may be implemented. Note that the system 200 can be implemented in the context of a software module such as program module 125. The system 200 includes a network 202 in communication with one or more clients 210, 212, and 214. Network 202 is a medium that can be used to provide communications links between various devices and computers connected together within a networked data processing system such as computer system 100. Network 202 may include connections such as wired communication links, wireless communication links, or fiber optic cables. Network 202 can further communicate with one or more servers 206, one or more external devices such as a sensor 204, an external device 205 (such as a circuit, testing system, copier, fax, scanner, multifunction device, hardware assembly, etc.) and a memory storage unit such as, for example, memory or database 208.

In the depicted example, sensor 204, external device 205, and server 206 connect to network 202 along with storage unit 208. In addition, clients 210, 212, and 214 connect to network 202. These clients 210, 212, and 214 may be, for example, personal computers, network computers, mobile devices, or tablet devices. Computer system 100 depicted in FIG. 1 can be, for example, a client such as client 210, 212, and/or 214. Alternatively, clients 210, 212, and 214 may also be, for example, a photographic camera, video camera, printing device, sensor, etc.

Computer system 100 can also be implemented as a server such as server 206, depending upon design considerations. In the depicted example, server 206 provides data such as boot files, operating system images, applications, and application updates to clients 210, 212, and 214, and/or to sensor 204 and external device 205. Clients 210, 212, and 214 and video sensor 204 are clients to server 206 in this example. Network data-processing system 200 may include additional servers, clients, and other devices not shown. Specifically, clients may connect to any member of a network of servers, which provide equivalent content.

In the depicted example, network data-processing system 200 is the Internet with network 202 representing a worldwide collection of networks and gateways that use the Transmission Control Protocol/Internet Protocol (TCP/IP) suite of protocols to communicate with one another. At the heart of the Internet is a backbone of high-speed data communication lines between major nodes or host computers consisting of thousands of commercial, government, educational, and other computer systems that route data and messages. Of course, network data-processing system 200 may also be implemented as a number of different types of networks such as, for example, an intranet, a local area network (LAN), or a wide area network (WAN). FIGS. 1 and 2 are intended as examples and not as architectural limitations for different embodiments of the present invention.

FIG. 3 illustrates a computer software system 300, which may be employed for directing the operation of the data-processing systems such as computer system 100 depicted in FIG. 1. Software application 305, may be stored in memory 104, on removable storage 112, or on non-removable storage 114 shown in FIG. 1, and generally includes and/or is associated with a kernel or operating system 310 and a shell or interface 315. One or more application programs, such as module(s) 125, may be "loaded" (i.e., transferred from removable storage 112 into the memory 104) for execution by the data-processing system 100. The data-processing system 100 can receive user commands and data through user interface 315, which can include input 116 and output 118, accessible by a user 320. These inputs may then be acted upon by the computer system 100 in accordance with instructions from operating system 310 and/or software application 305 and any software module(s) 125 thereof.

Generally, program modules (e.g., module 125) can include, but are not limited to, routines, subroutines, software applications, programs, objects, components, data structures, etc., that perform particular tasks or implement particular abstract data types and instructions. Moreover, those skilled in the art will appreciate that the disclosed method and system may be practiced with other computer system configurations such as, for example, hand-held devices, multi-processor systems, data networks, microprocessor-based or programmable consumer electronics, networked personal computers, minicomputers, mainframe computers, servers, and the like.

Note that the term module as utilized herein may refer to a collection of routines and data structures that perform a particular task or implements a particular abstract data type. Modules may be composed of two parts: an interface, which lists the constants, data types, variable, and routines that can be accessed by other modules or routines, and an implementation, which is typically private (accessible only to that module) and which includes source code that actually implements the routines in the module. The term module may also simply refer to an application such as a computer program designed to assist in the performance of a specific task such as word processing, accounting, inventory management, etc.

The interface 315 (e.g., a graphical user interface 130) can serve to display results, whereupon a user 320 may supply additional inputs or terminate a particular session. In some embodiments, operating system 310 and GUI 130 can be implemented in the context of a "windows" system. It can be appreciated, of course, that other types of systems are possible. For example, rather than a traditional "windows" system, other operation systems such as, for example, a real time operating system (RTOS) more commonly employed in wireless systems may also be employed with respect to operating system 310 and interface 315. The software application 305 can include, for example, module(s) 125, which can include instructions for carrying out steps or logical operations such as those shown and described herein.

The following description is presented with respect to embodiments of the present invention, which can be embodied in the context of a data-processing system such as computer system 100, in conjunction with program module 125, and data-processing system 200 and network 202 depicted in FIGS. 1-2. The present invention, however, is not limited to any particular application or any particular environment. Instead, those skilled in the art will find that the system and method of the present invention may be advantageously applied to a variety of system and application software including database management systems, word processors, and the like. Moreover, the present invention may be embodied on a variety of different platforms including Macintosh, UNIX, LINUX, and the like. Therefore, the descriptions of the exemplary embodiments, which follow, are for purposes of illustration and not considered a limitation.

The embodiments disclosed herein include methods and systems for material characterization using an open circuit voltage decay (OCVD) system. In certain embodiments, the effective lifetime of devices can be determined according to the systems and methods disclosed. In general, the OCVD methods and systems disclosed herein provide a viable technique for extracting the effective lifetime from packaged pn junction devices. OCVD is more accurate than the various other methods used for the same purpose, largely because device lifetime is the fundamental quantity measured with the OCVD technique (as opposed to extrapolating the lifetime from a sample's conductance, as in prior art methods).

Figures 4A, 4B:
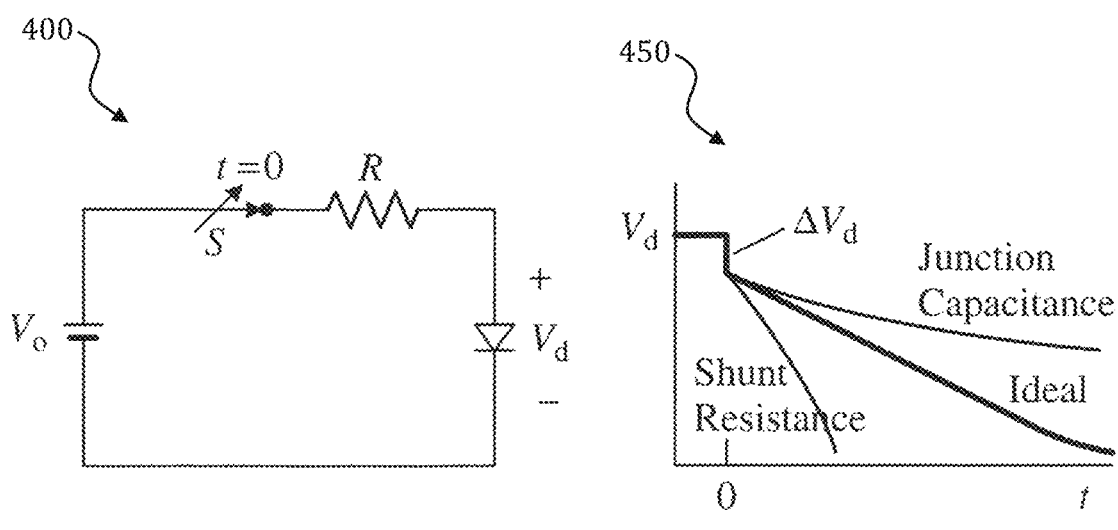
FIG. 4A depicts a circuit diagram of an analytics system in accordance with the disclosed embodiments.
FIG. 4B depicts a chart illustrating a principle of operation of the disclosed embodiments.

FIG. 4A provides a schematic diagram of a system 400, illustrative of the general principle associated with the methods and systems disclosed herein. FIG. 4B provides a chart 450 illustrating the principle.

As illustrated in FIG. 4A, a forward bias can be applied for a finite time to a system 400. The junction can then be disconnected (ideally, in a Galvanic manner, although other disconnection methods may also be used) from the source. Once the source is removed from the junction, the voltage immediately drops by an amount (AV) due to the junction's internal series resistance, and then decays (assuming no parallel resistance) due to recombination of the injected carriers.

Figure 5:
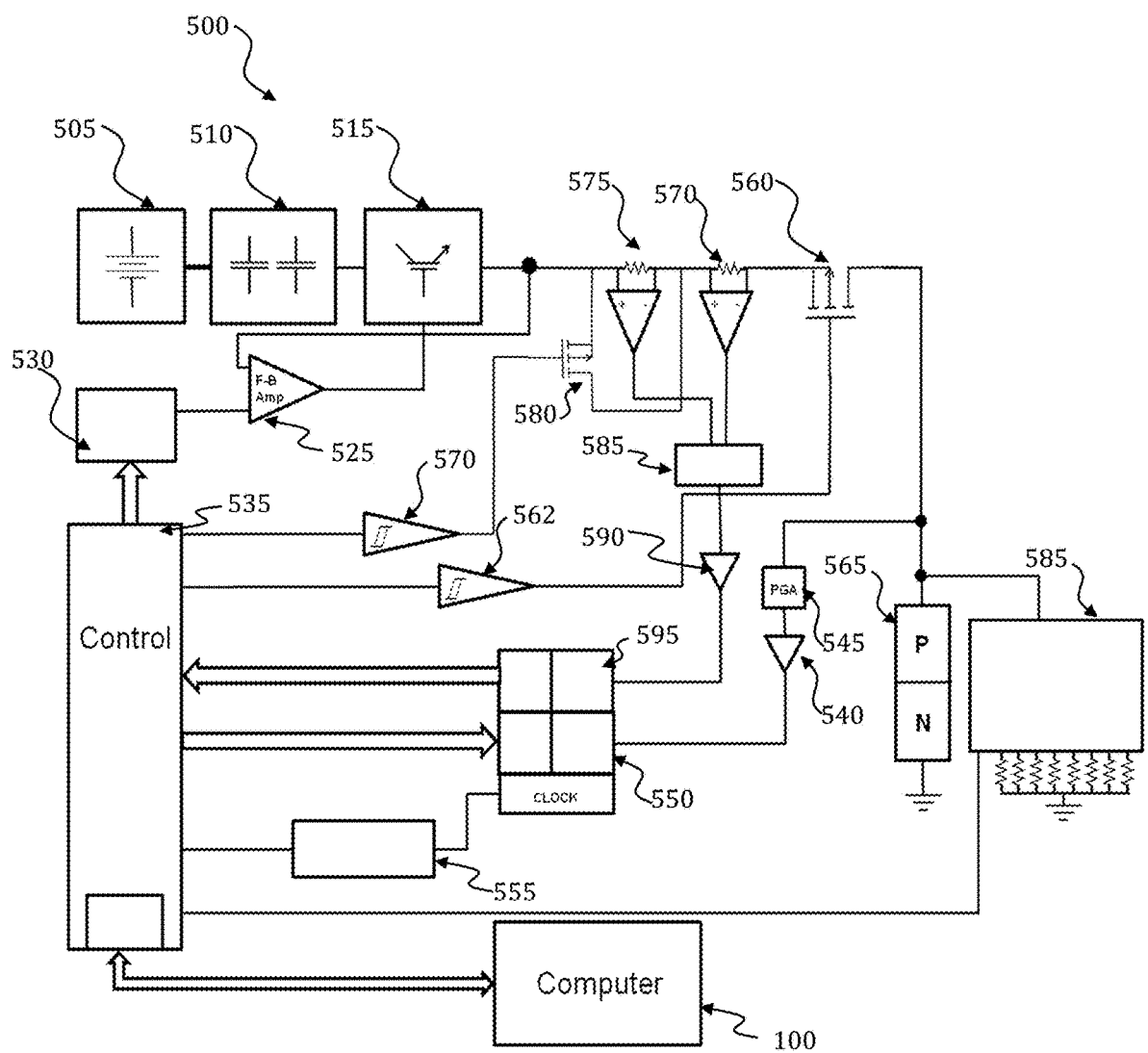
FIG. 5 depicts an analytics system in accordance with the disclosed embodiments.

FIG. 5 illustrates a diagram of a system 500 configured to perform the OCVD technique in an accurate manner over a very wide injection range. It should be noted that the system 500 does not have significant parasitics affecting measurement and does not have unacceptable (i.e. on the order of a joule) heating, even when applied to high injection regimes.

The system 500 includes a high current, controllable source. The source is specifically configured to provide injection that can operate in a pulsed manner, to avoid heating and altering system measurements. An electronically controlled, fast, nearly ideal, switch serves to disconnect the device under test (DUT) when required. A voltage measurement system with widely variable sampling rates can be included. A current measurement system is provided that is capable of monitoring a range of approximately 1 milliamp to 100 amps. Software can be included that circumvents the inherent abstraction of the lifetime caused by heavy filtering and differentiating. A controllable parallel resistance is used to compensate for parallel capacitance.

All of these features are incorporated in the system 500. The system 500 can apply a controlled voltage pulse through a high-power linear amplifier fed by low equivalent series resistance (ESR) high capacitance capacitors 510, which are charged from a low power voltage source 505. In some embodiments the voltage source 505 can be a 12 V source although it should be understood that other voltage sources can also be used.

Three Insulated Gate Bipolar Junction Transistors 515 (IGBTs) arranged in parallel are used to form a high voltage/current series pass element that is controlled by a high gain feedback amplifier 525 which is in turn fed by a 10-bit Digital to Analog Converter (DAC) 530. The DAC 530 receives data from the system's microcontroller 535 (in certain embodiments this can comprise a PIC 18F6585) via a Serial Peripheral Interface (SPI) protocol. The voltage waveform at the output terminals (the DUT voltage) is acquired through a differential amplifier 540 and a Programmable Gain Amplifier (PGA) 545 and is fed into a high-speed Analog to Digital Converter (ADC) 550 with built in RAM memory.

The voltage read in the ADC 550 has a separate, programmable clock 555 that is controlled by the microcontroller 535 and can range from approximately 1 MHz to 200 MHz. In series with the DUT is a low RDS—on MOSFET 560 with a custom designed fast gate driver 562 that is used to disconnect the pn junction 565 quickly from the driving source and through two precision shunt resistors, for acquiring the current waveform. One of the shunt resistors is paralleled with another low RDS—on MOSFET 580 (driven at a slower rate) to read relatively low current levels and give the system 500 a wide range of injected current. These current shunts are attached to two differential amplifiers, amplifier 570 and amplifier 575 that are fed through a multiplexer 585 and into another PGA (illustrated as 585), a differential amplifier 590, and high-speed ADC/RAM unit 595. The addition of a relatively high voltage analog multiplexer 585 on the output terminals gives the user the ability to add programmable parallel resistance to the pn junction 565 being evaluated in order to compensate for device, system, or cabling capacitances.

Figure 6:
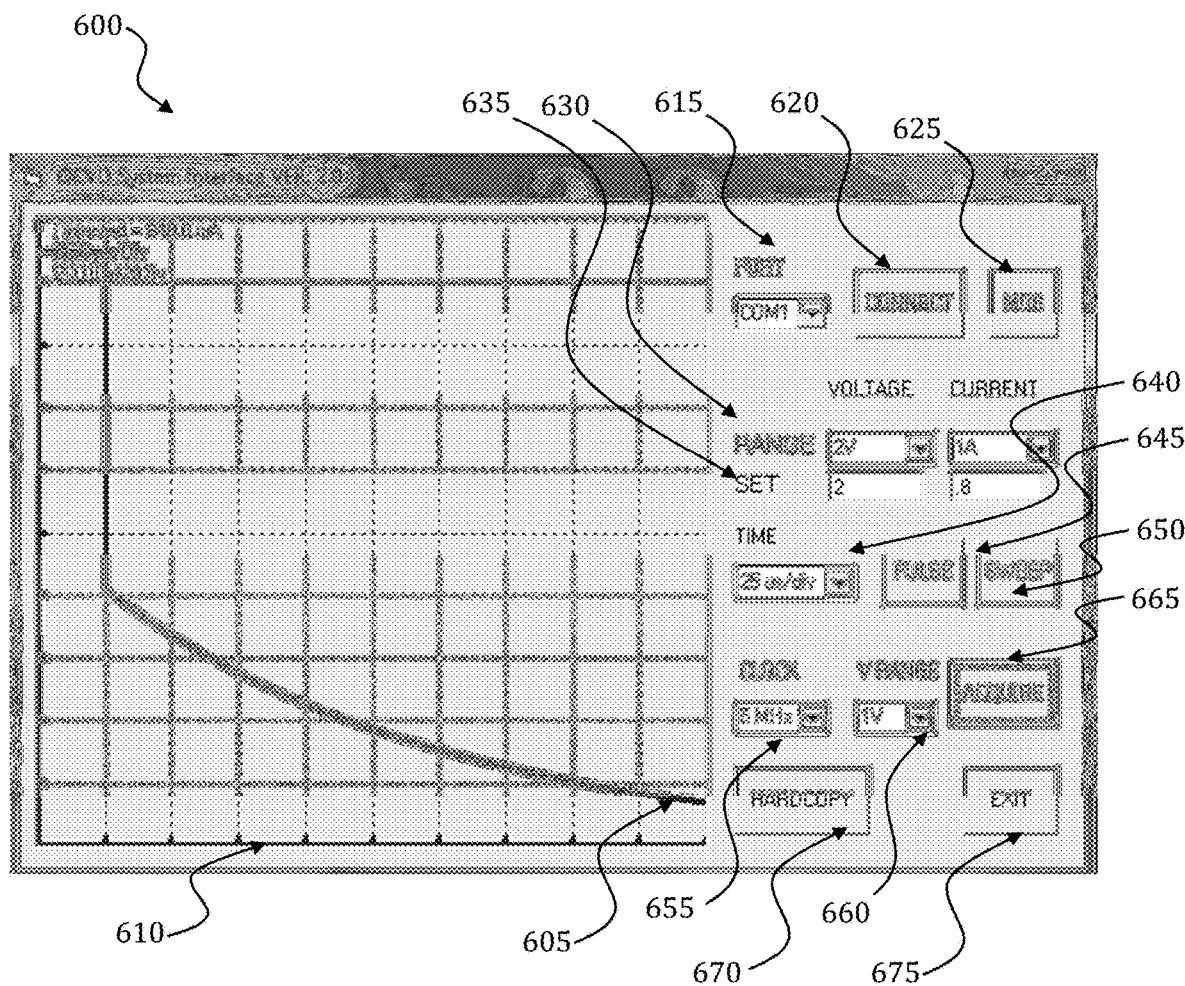
FIG. 6 depicts a graphical user interface associated with an analytics system in accordance with the disclosed embodiments.

The OCVD system 500 can include specially designed software to implement methods as described herein. A GUI, can be implemented in order to communicate with the system, send commands to the OCVD system, and collect data and waveforms for display and manipulation. FIG. 6 illustrates an exemplary GUI 600 in accordance with the disclosed embodiments. In FIG. 6, the GUI 600 is shown in "DEBUG mode" (but may operate in other modes, such as "normal mode") with an OCVD decay waveform 605 in the display area 610. The GUI includes straight forward, intuitive controls including a port field menu 615, a connect radio button 620, a MOS radio button 625, voltage and current ranges 630 and set 635 field, a time menu 640, a pulse radio button 645, a sweep radio button 650, a clock 655 with a frequency menu, a V range with a range menu 660, an acquire radio button 665, a hardcopy or print radio button 670 and an exit button 675.

From the GUI, a user can initiate a single, set voltage pulse and acquire the resulting voltage and current waveforms with the system 500. The user can further set limits (compliance) for voltage and current and perform an IV sweep of currents ranging from milliamps up to 200 A, at up to 10 V, or the user can specify a current injection level and the system will pulse this current for approximately 100 µs (or other desired amount of time) followed by initiation of a voltage read and disconnection of the attached pn junction. The voltage waveform can be displayed on the screen along with the current injection level. For any of these functions, data can be saved as both a CSV and an image file in a specifically created folder in the computer system 100 with the hardcopy button 670.

Figure 7:
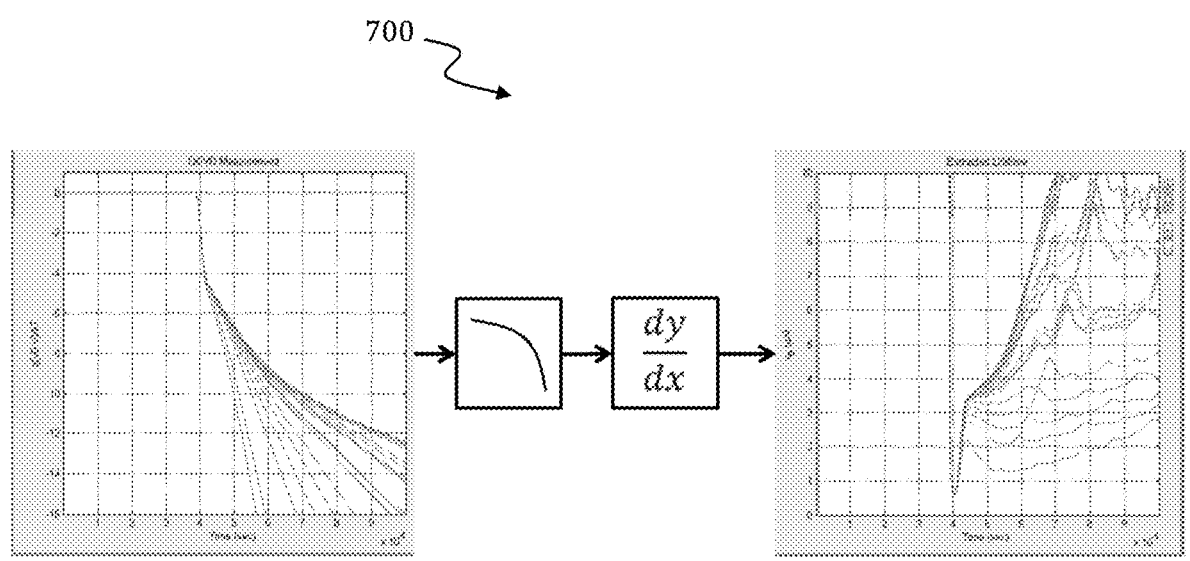
FIG. 7 depicts a chart graphically illustrating an analytics method in accordance with the disclosed embodiments.
Figure 8:
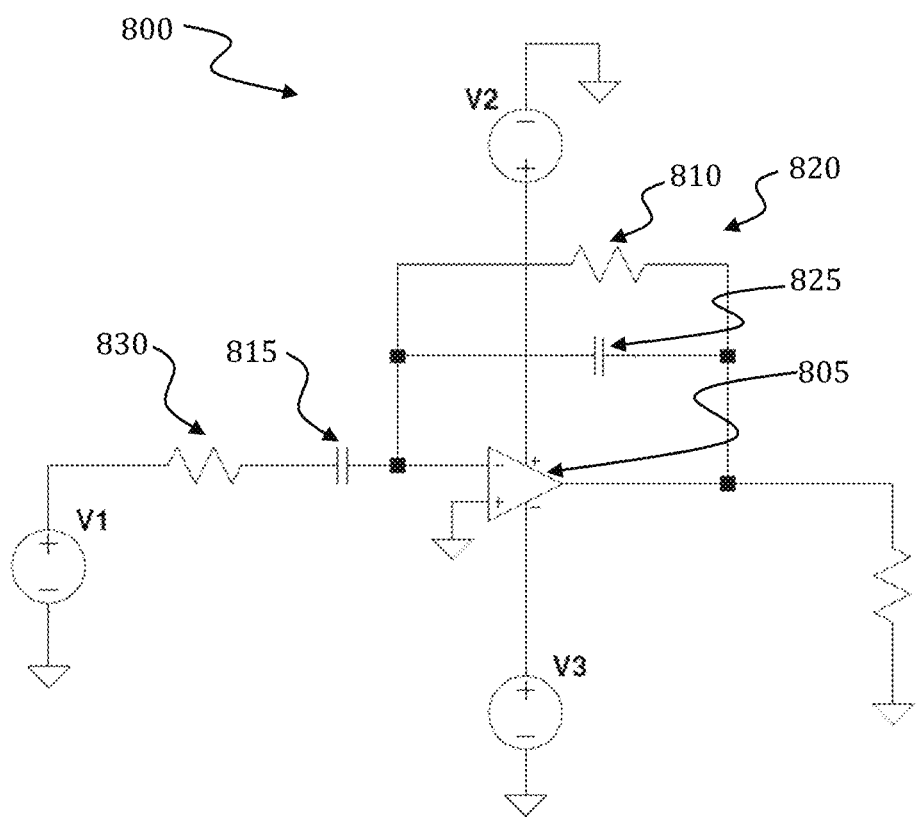
FIG. 8 depicts a circuit diagram of a system that can be used in association with an analytics method in accordance with the disclosed embodiments.

In order to calculate the effective carrier lifetime from the OCVD decay waveform (e.g. waveform 605), the slope of the voltage decay must be extracted. This can be accomplished by extracting the slope, and essentially filtering the raw data. Next, numerical differentiation can be performed on the extracted data. FIG. 7 provides a chart 700 illustrating a numerical differentiation technique in accordance with the disclosed embodiments. Another technique for the required data analysis, is to incorporate an analog differentiator circuit in the system. FIG. 8 illustrates an analog differentiator 800 that can be used in certain embodiments for such data analysis.

While both of these options are viable for OCVD lifetime extraction, actual implementation across a broad signal spectrum is complicated by the fact that real life data is inherently noisy, the act of differentiation increases the level of noise in the data (hence the pre-filtering). Furthermore, filtering further abstracts the actual data from the original signal. In addition, the level of the voltage drop due to series resistance in a pn junction can be significant; if this drop is several volts in magnitude, and the desired signal a few millivolts, the derivative can be "saturated" in an analog circuit and incorrectly calculated by numerical differentiation. In FIG. 8 integrated circuit 805, resistor 810 and capacitor 815 comprise an ideal differentiator circuit 820.

Capacitor 825 and resistor 830 are necessary in a practical circuit to roll off high frequency oscillations and limit high frequency gain, respectively.

Figure 9:
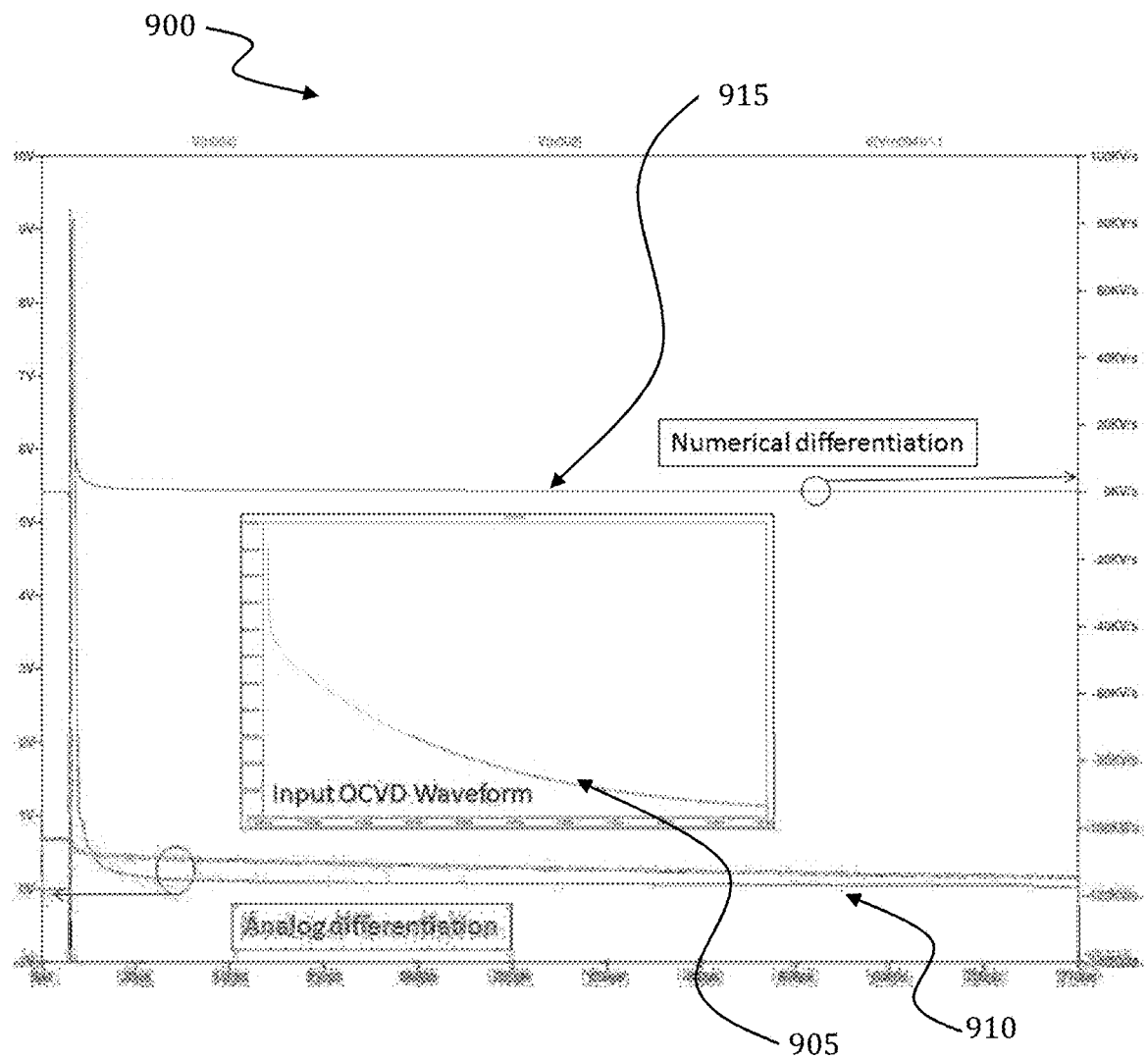
FIG. 9 depicts an exemplary output in accordance with the disclosed embodiments.

FIG. 9 provides an exemplary output 900. In this example, the output illustrated is for the LTspice using the OCVD decay of a built-in diode model. The inset 905 in FIG. 9 illustrates the ideal OCVD decay of a spice diode (e.g. a GSD2004 model), the output of the analog differentiator is the trace 910, and the trace 915 is the inverted (to match the inverted derivative of the analog differentiator's output) result of LTspice performing a numerical derivative of the input signal. The numerical signal displays a major flaw in the derivative approach in general; the sought-after rate of change, i.e. the actual linear decay that is proportional to the SRH lifetime, is hidden within very large rates of change due to the initial transient decay from the abrupt removal of the pn junction from the applied current.

Even in the idealized simulation illustrated in FIG. 9, with relatively smooth decay waveforms, the derivative of the initial transient produces rates of change in the kV range (see the scale on right side of graph). In a real OCVD system, where very high injection levels can be imposed upon the DUT near the end of an IDLS sweep, the derivative of the initial transient signal will be orders of magnitude larger than the signal of interest. Even the simulated output of the analog differentiator, as shown in FIG. 9, is seen to hit the OP AMP rail. In a practical circuit, there is a recovery period for an analog differentiator that swamp the desired signal entirely. When the added noise of real data is considered, the results of an analog differentiator circuit may be untrustworthy.

Thus, in another embodiment intended to address the inherent problems associated with the extraction of the decay waveform's slope, and hence the carrier lifetime, a method 1000 can be implemented on a computer, such as computer system 100, and in connection with the system 500, that makes use of the data set(s) acquired from the DUT using system 500. The method begins at 1005.

The method 1000 first requires identification of a line segment of chosen length (data points) as shown at 1010. The line segment "slides" down the data set in an arbitrarily chosen interval as shown at 1015. As illustrated at 1020 the line segment is calculated via the least—squares method at each point along its path on the interval. At each point on this interval, the average distance from the line to each data point in the interval is calculated and used as a figure of merit for the "linearity" of the segment as illustrated at 1025. In this way, the actual slope is calculated at 1030, instead of a number that is, in reality, removed from the slope by the filtering and differentiating processes. The method ends at 1035.

Figure 10:
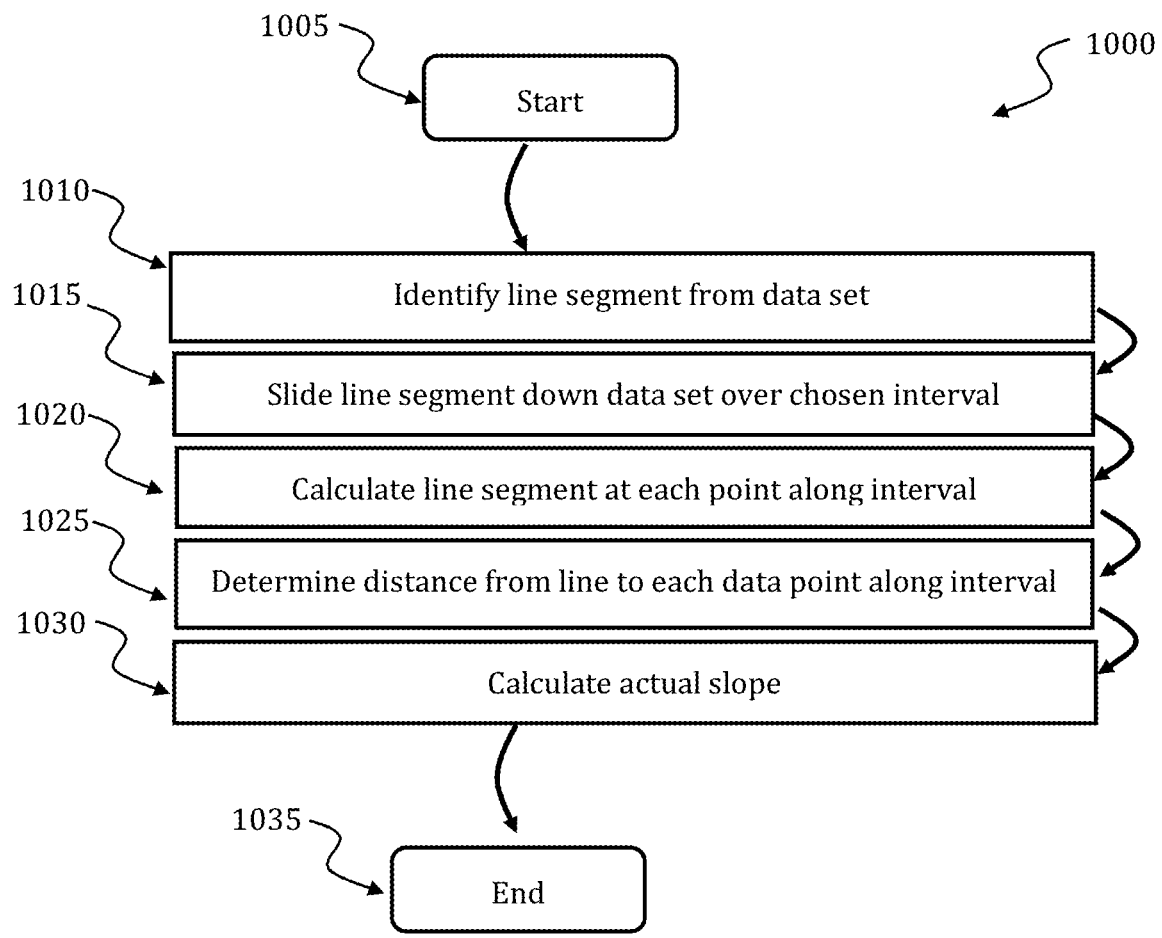
FIG. 10 depicts a flow chart illustrating steps associated with an analytics method in accordance with the disclosed embodiments.
Figure 11:
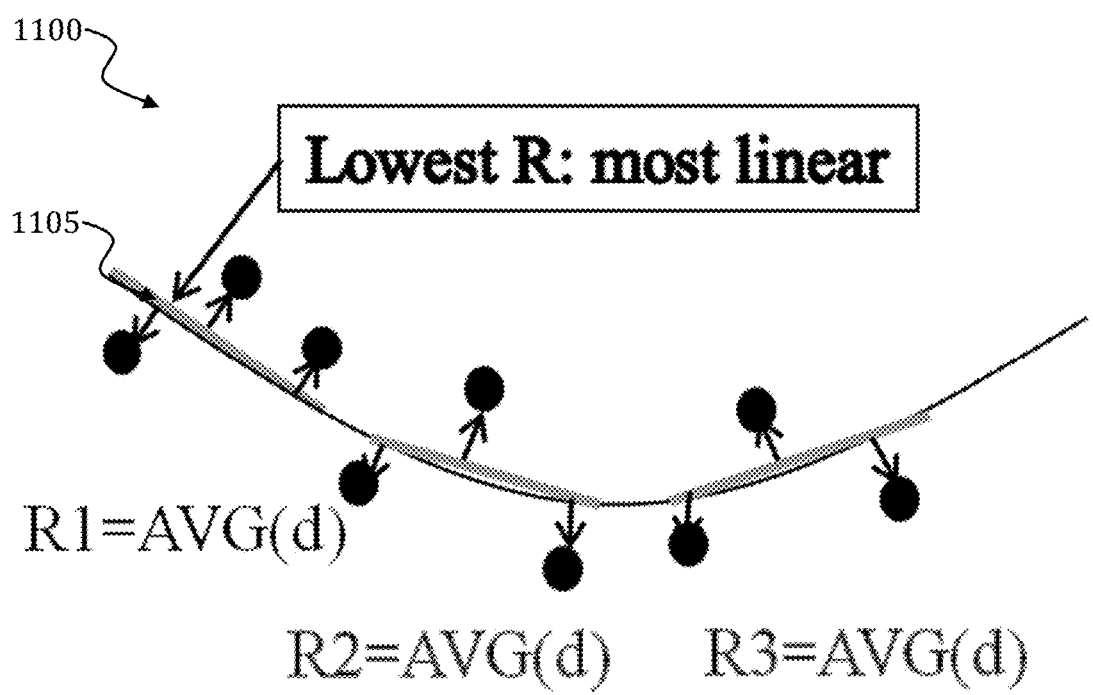
FIG. 11 depicts a visual representation of an analytics solution in accordance with the disclosed embodiments.
Figure 12:
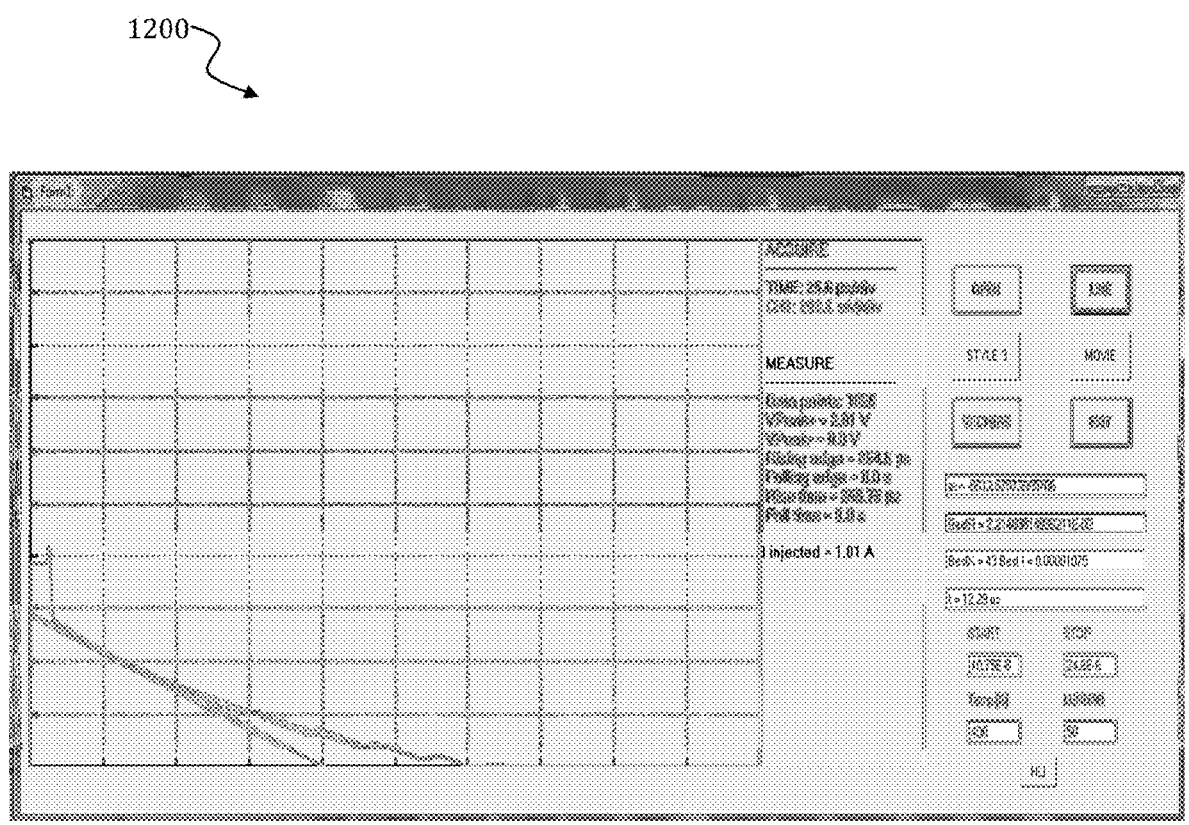
FIG. 12 depicts an exemplary output associated with an analytics system and method in accordance with the disclosed embodiments.

FIG. 11 illustrates a graphic illustration 1100 of the method 1000 disclosed in FIG. 10, which can be implemented by system 500. First, an algorithm can be used to find the most linear segment (in this case segment 1105) of the signal and the slope can be recorded. This is "dv/dt", which is required for the lifetime calculation. The effective lifetime can then be calculated from this slope. The system can also calculate the temperature (e.g. entered as degrees Kelvin), and whether the decay is from low-level or high-level injection according to formula (1):

$$F(t) = -\eta \frac{kT}{q} \wedge \frac{dv(t)}{dt}^{-1} \quad (1)$$

Where η is the injection-dependent ideality factor. An illustration of the GUI 130 providing results as described above is provided in chart 1200 of FIG. 12.

In certain embodiment the OCVD System may require additional procedural readiness steps including verification and calibration. The OCVD system can undergo basic functionality testing including IV curve tracing from very low, mA ranges, up through 100 A with the expectation that good results are produced.

Figure 13:
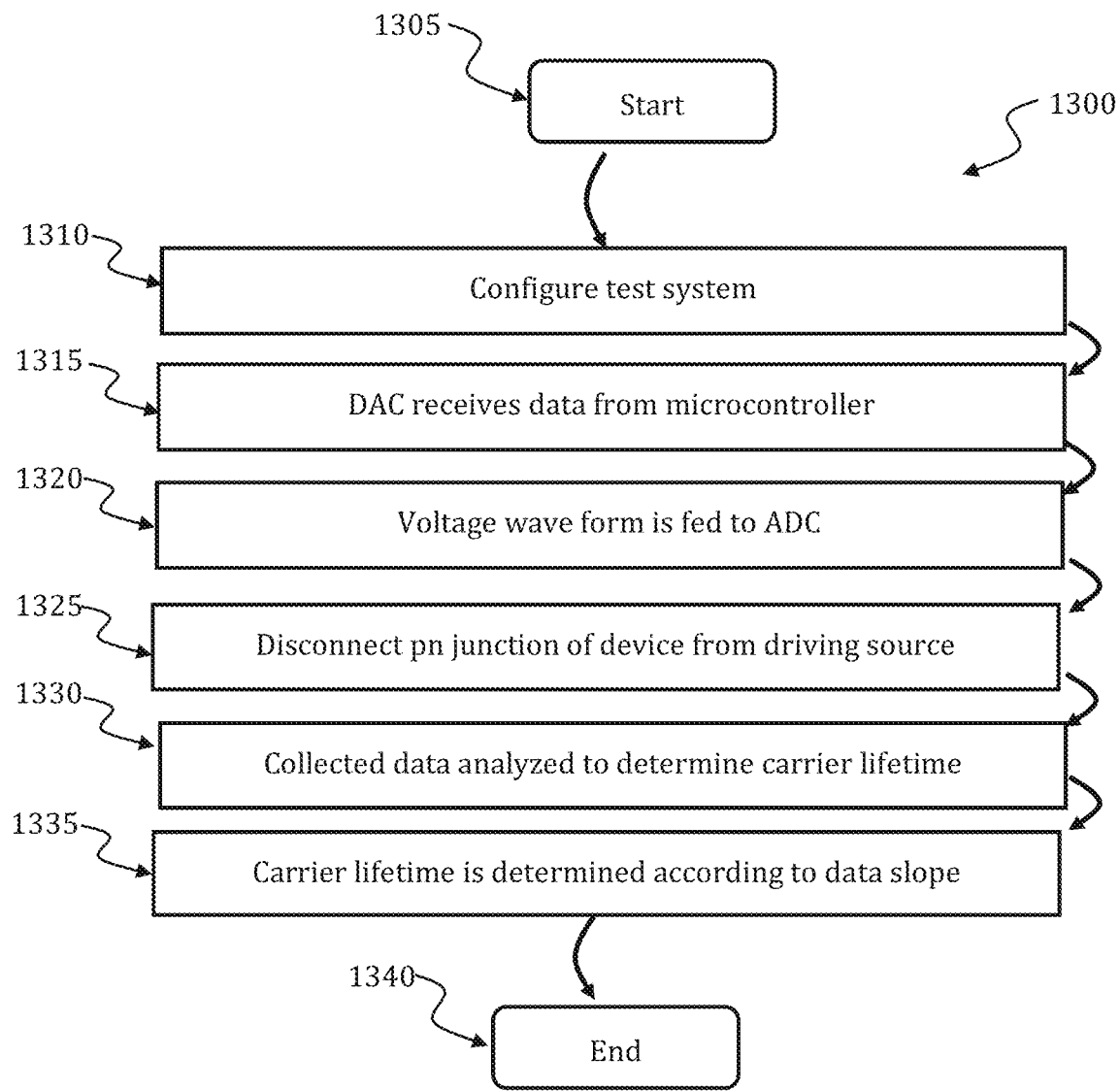
FIG. 13 depicts a flow chart illustrating steps associated with an analytics method in accordance with the disclosed embodiments.

FIG. 13 illustrates a method 1300 for evaluating the carrier lifetime of a device in accordance with the disclosed embodiments. The method begins at 1305.

At 1310, a test system, such as the system 500 illustrated in FIG. 5, can be configured. The test system applies a controlled voltage pulse through a high-power linear amplifier fed by low ESR high capacitance capacitors which are charged from a low power voltage source. Parallel IGBTs are used to form a high voltage/current series pass element controlled by a high gain feedback amplifier. As shown at 1315 a DAC receives data from a microcontroller. The voltage waveform at the output terminals is acquired through a differential amplifier and a Programmable Gain Amplifier (PGA) and is fed into a high-speed Analog to Digital Converter (ADC) with built in RAM memory as shown at 1320.

The waveform from the system can be acquired using a custom designed fast gate driver as illustrated in FIG. 5, that is used to disconnect the pn junction quickly from the driving source and through two precision shunt resistors as illustrated at 1325. One of the shunt resistors is paralleled with another low RDS—on MOSFET (driven at a slower rate) to read relatively low current levels and give the system a wide range of injected current. These current shunts are attached to two differential amplifiers that are fed through a multiplexer into another PGA and high-speed ADC/RAM unit. The addition of a relatively high voltage analog multiplexer on the output terminals provides the ability to add programmable parallel resistance to the pn junction of the device being evaluated in order to compensate for device system or cabling capacitances.

At 1330 the data collected from the system illustrated in FIG. 5, can be subject to a method for determining the carrier lifetime as illustrated in FIG. 10. The method includes the determination of the actual slope of the data which is used to calculate carrier lifetime as illustrated at 1335 and as described above. The method then ends at 1340.

The methods and systems disclosed herein have been proven to be more accurate than other prior art approaches and do not suffer the common falsely elevated low-level readings of optical methods. Importantly, the embodiments are also convenient for use with packaged devices. In addition, the embodiments disclosed herein are completely electrical, non-destructive, and require only two connections through wires to the device, allowing ease of access to temperature chambers.

Based on the foregoing, it can be appreciated that a number of embodiments, preferred and alternative, are disclosed herein. For example, in one embodiment, an analytics system comprises a voltage source, a switch configured to disconnect a test piece from the source, an assembly configured to collect a voltage versus time measurement and a current versus time measurement, and an analytics module configured to identify a carrier lifetime of the test piece according to the measured voltage versus time and the measured current versus time. The voltage source can further comprise a pulsed voltage source. In an embodiment the system further comprises at least two low equivalent series resistance capacitors charged by the voltage source.

In an embodiment the analytics module further comprises: at least one processor; and a storage device communicatively coupled to the at least one processor, the storage device storing instructions which, when executed by the at least one processor, cause the at least one processor to perform operations comprising: determining a slope of a waveform collected from the voltage versus time measurement and the current versus time measurement and calculating a carrier lifetime from the slope.

In an embodiment the system further comprises a control configured to provide a variable sampling rate for the voltage versus time measurement. The system further comprises a current versus time measurement applicable to current in a range from 1 milliamp to 100 amps.

In certain embodiments the work piece comprises a p-n junction device.

In another embodiment n analytics apparatus comprises a voltage source, a switch configured to disconnect a test piece from the source, an assembly for measuring a voltage versus time and a current versus time, and an analytics module configured to identify a carrier lifetime of the test piece according to the measured voltage versus time and the measured current versus time. The voltage source can further comprise a pulsed voltage source. In an embodiment the analytics apparatus further comprises at least two low equivalent series resistance capacitors charged by the voltage source.

In an embodiment the analytics module further comprises at least one processor and a storage device communicatively coupled to the at least one processor, the storage device storing instructions which, when executed by the at least one processor, cause the at least one processor to perform operations comprising: determining a slope of a waveform collected from the voltage versus time measurement and the current versus time measurement and calculating a carrier lifetime from the slope.

In an embodiment the analytics apparatus further comprises a control configured to provide a variable sampling rate for the voltage versus time measurement. The current versus time measurement can be applicable to current in a range from 1 milliamp to 100 amps.

In an embodiment the work piece comprises a p-n junction device.

In yet another embodiment a method for measuring carrier lifetime comprises subjecting a test device to a voltage via a voltage source associated with the test system, disconnecting the test device from the voltage source, measuring a voltage as a function of time, measuring a current as a function of time, and determining a carrier lifetime of the test piece according to the measured voltage and the measured current. The voltage source further comprises a pulsed voltage source. The method can further comprise charging at least two low equivalent series resistance capacitors with the voltage source.

In an embodiment the method further comprises determining a slope of a waveform of the voltage as a function of time and the current as a function of time and calculating a carrier lifetime from the slope. In an embodiment a variable sampling rate control is used to collect the voltage as a function of time and the monitored current range comprises 1 milliamp to 100 amps. In an embodiment the test piece comprises a p-n junction device.

It will be appreciated that variations of the above-disclosed and other features and functions, or alternatives thereof, may be desirably combined into many other different systems or applications. Also, it should be appreciated that various presently unforeseen or unanticipated alternatives, modifications, variations or improvements therein may be subsequently made by those skilled in the art which are also intended to be encompassed by the following claims.

What is claimed is:

1. A system comprising:
a voltage source;
a switch configured to disconnect a test piece from said voltage source;
an assembly configured to collect a voltage versus time measurement and a current versus time measurement; and
an analytics module comprising at least one processor and a storage device communicatively coupled to the at least one processor, the storage device comprising non-transitory computer-readable media which, when executed by the at least one processor, cause the at least one processor to perform operations comprising: identifying a carrier lifetime of said test piece according to said measured voltage versus time and said measured current versus time.

2. The system of claim 1 wherein said voltage source further comprises a pulsed voltage source.

3. The system of claim 1 further comprising:
at least two low equivalent series resistance capacitors charged by said voltage source.

4. The system of claim 1 where said analytics module is further configured for:
determining a slope of a waveform collected from said voltage versus time measurement and said current versus time measurement; and
calculating a carrier lifetime from said slope.

5. The system of claim 1 further comprising:
a control configured to provide a variable sampling rate for said voltage versus time measurement.

6. The system of claim 1 wherein said current versus time measurement is applicable to current in a range from 1 milliamp to 100 amps.

7. The analytics system of claim 1 wherein said work piece comprises a p-n junction device.

8. An analytics apparatus comprising:
a voltage source;
a switch configured to disconnect a test piece from said voltage source;
an assembly for measuring a voltage versus time and a current versus time; and
an analytics module comprising at least one processor and a storage device communicatively coupled to the at least one processor, the storage device comprising non-transitory computer-readable media which, when executed by the at least one processor, cause the at least one processor to perform operations comprising: identifying a carrier lifetime of said test piece according to said measured voltage versus time and said measured current versus time.

9. The analytics apparatus of claim 8 wherein said voltage source further comprises a pulsed voltage source.

10. The analytics apparatus of claim 8 further comprising:
at least two low equivalent series resistance capacitors charged by said voltage source.

11. The analytics apparatus of claim 8 where said analytics module is further configured for:
determining a slope of a waveform collected from said voltage versus time measurement and said current versus time measurement; and
calculating a carrier lifetime from said slope.

12. The analytics apparatus of claim 8 further comprising:
a control configured to provide a variable sampling rate for said voltage versus time measurement.

13. The analytics apparatus of claim 8 wherein said current versus time measurement is applicable to current in a range from 1 milliamp to 100 amps.

14. The analytics apparatus of claim 8 wherein said work piece comprises a p-n junction device.

15. A method for measuring carrier lifetime said method comprising:
subjecting a test device to a voltage via a voltage source associated with a test system;
disconnecting said test device from said voltage source;
measuring a voltage as a function of time;
measuring a current as a function of time; and
determining a carrier lifetime of said test device according to said measured voltage and said measured current.

16. The method of claim 15 wherein said voltage source further comprises a pulsed voltage source.

17. The method of claim 15 further comprising:
charging at least two low equivalent series resistance capacitors with said voltage source.

18. The method of claim 15 further comprising:
determining a slope of a waveform of said voltage as a function of time and said current as a function of time; and
calculating a carrier lifetime from said slope.

19. The method of claim 15 wherein a variable sampling rate control is used to collect said voltage as a function of time; and wherein a monitored current range comprises 1 milliamp to 100 amps.

20. The method of claim 15 wherein said test device comprises a p-n junction device.

* * * * *